United States Patent
Chang et al.

(10) Patent No.: US 7,812,413 B2
(45) Date of Patent: Oct. 12, 2010

(54) MOSFET DEVICES AND METHODS FOR MAKING THEM

(75) Inventors: Shih-Hsun Chang, Hsinchu (TW); Lars-Ake Ragnarsson, Leuven (BE)

(73) Assignees: IMEC, Leuven (BE); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 12/233,286

(22) Filed: Sep. 18, 2008

(65) Prior Publication Data

US 2009/0090971 A1 Apr. 9, 2009

Related U.S. Application Data

(60) Provisional application No. 60/974,039, filed on Sep. 20, 2007.

(30) Foreign Application Priority Data

May 9, 2008 (EP) .................................. 08156018

(51) Int. Cl.
*H01L 29/78* (2006.01)
*H01L 21/8238* (2006.01)
*H01L 21/336* (2006.01)
*H01L 21/3205* (2006.01)
*H01L 21/4763* (2006.01)
*H01L 29/49* (2006.01)
*H01L 29/51* (2006.01)

(52) U.S. Cl. ........................ 257/411; 257/369; 257/408; 257/413; 257/E29.154; 257/E29.165; 257/E21.623; 257/E21.625; 257/E21.632; 257/E21.634; 257/E21.636; 257/E21.637; 257/E21.639; 438/216; 438/287; 438/301; 438/591; 438/682

(58) Field of Classification Search ...................... None
See application file for complete search history.

(56) References Cited

U.S. PATENT DOCUMENTS

| | | | | |
|---|---|---|---|---|
| 2004/0191997 A1* | 9/2004 | Kawahara et al. | | 438/287 |
| 2005/0048728 A1* | 3/2005 | Kawahara | | 438/287 |
| 2009/0152636 A1* | 6/2009 | Chudzik et al. | | 257/369 |
| 2009/0152650 A1* | 6/2009 | Chudzik et al. | | 257/410 |
| 2009/0263961 A1* | 10/2009 | Kher | | 438/591 |

FOREIGN PATENT DOCUMENTS

EP 1179837 2/2002

OTHER PUBLICATIONS

Nadia Lifshitz. Dependence of the Work-Function Difference Between the Polysilicon Gate and Silicon Substrate on the Doping Level in Polysilicon. Mar. 1985. IEEE Transactions on Electron Devices. vol. 32, No. 3. pp. 617-621.*
Shiino et al. La2O3 Gate Dielectric Thin Film with Sc2O3 Buffer Layer for High Temperature Annealing. ECS Trans. 3, 511 (2006).*
European Search Report Application No. 08156018 dated Nov. 4, 2008.

* cited by examiner

*Primary Examiner*—Andy Huynh
*Assistant Examiner*—Hoang-Quan T Ho
(74) *Attorney, Agent, or Firm*—McDonnell Boehnen Hulbert & Berghoff LLP

(57) ABSTRACT

A semiconductor device is disclosed. The device comprises a first MOSFET transistor. The transistor comprises a substrate, a first high-k dielectric layer upon the substrate, a first dielectric capping layer upon the first high-k dielectric, and a first gate electrode made of a semiconductor material of a first doping level and a first conductivity type upon the first dielectric capping layer. The first dielectric capping layer comprises Scandium.

19 Claims, 8 Drawing Sheets

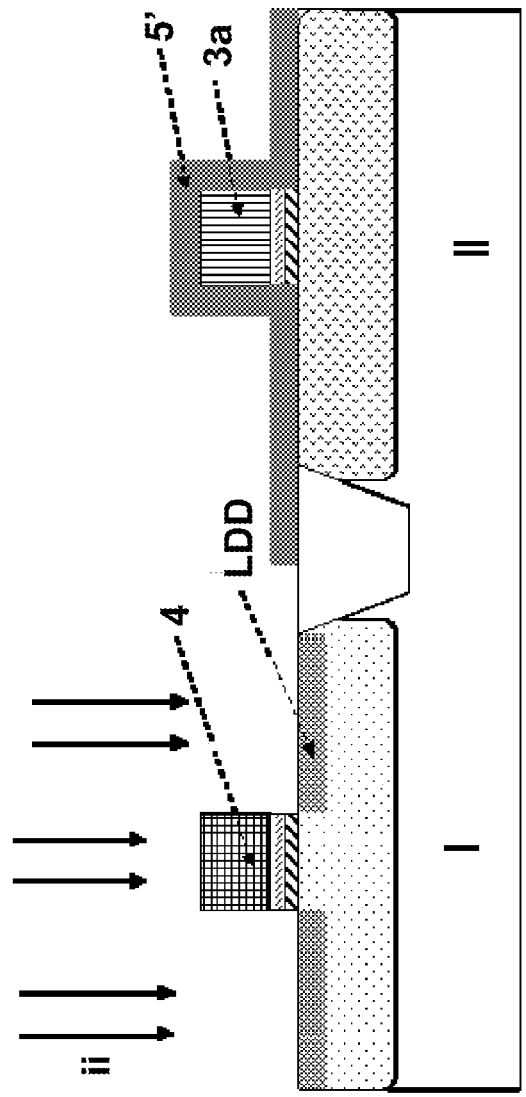
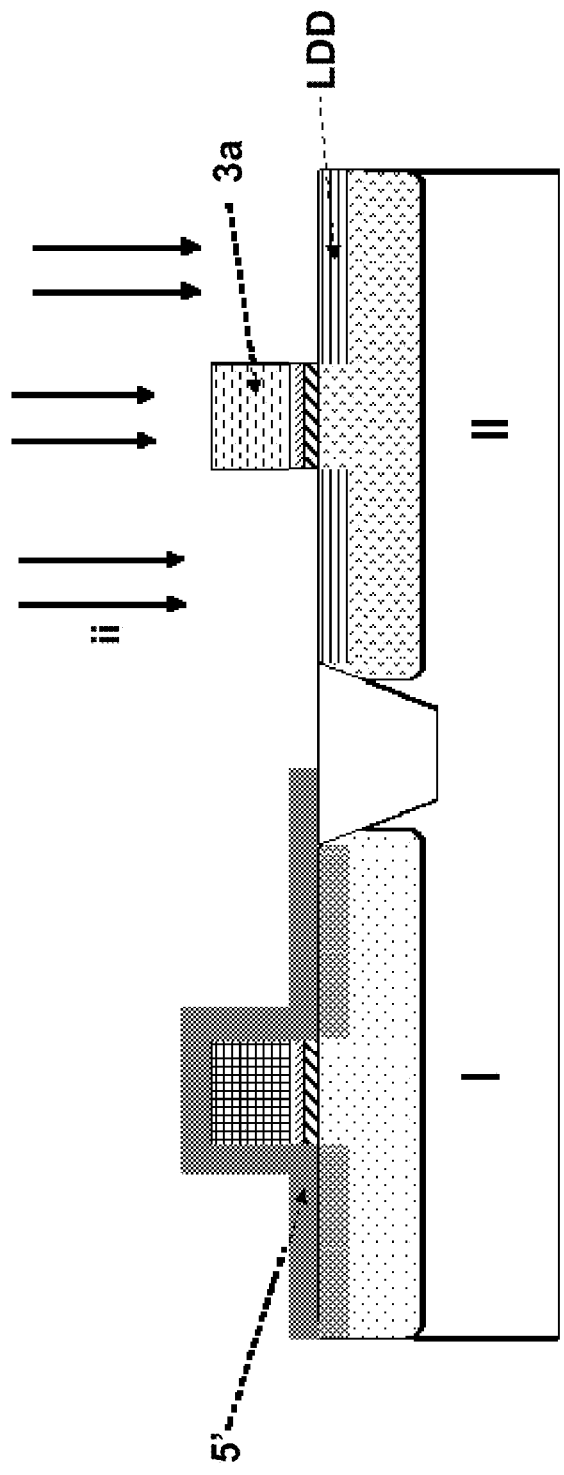

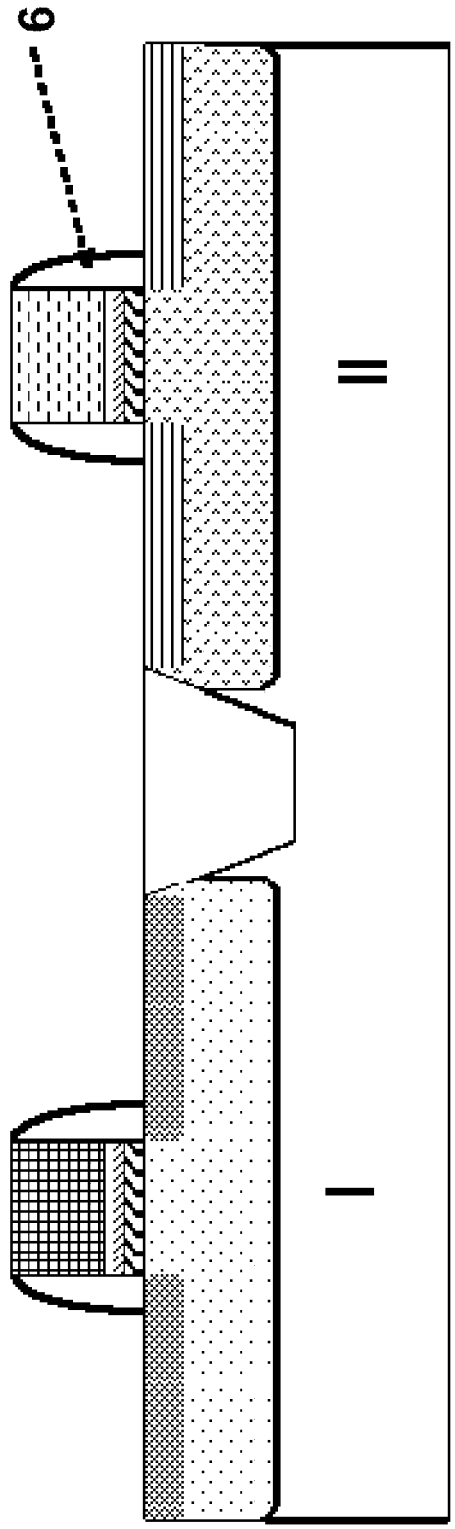
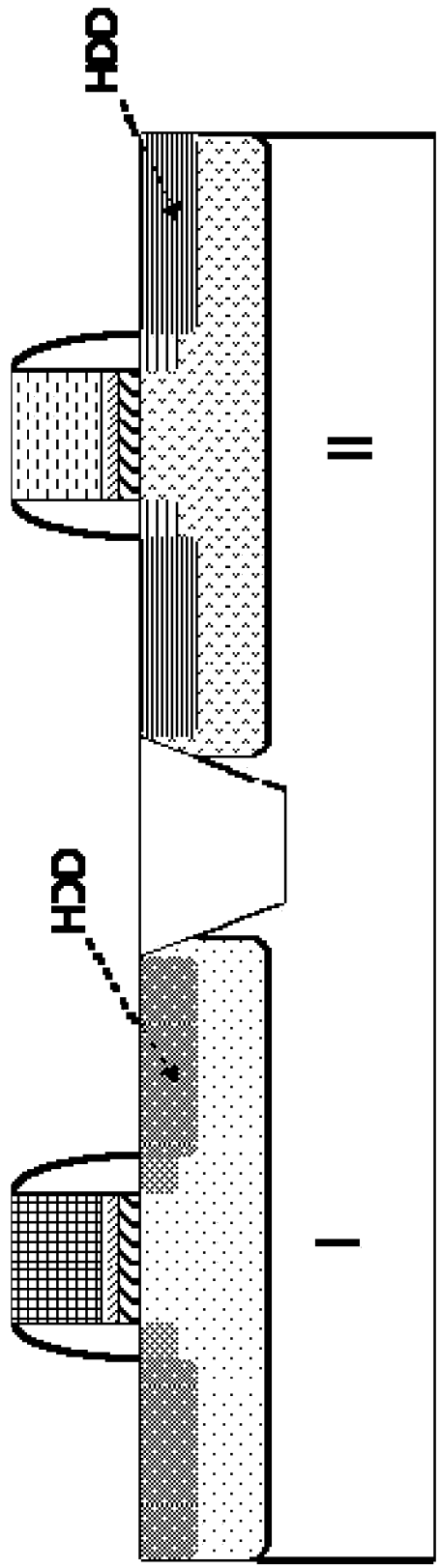
Figure 6g
Figure 6h

MOSFET DEVICES AND METHODS FOR MAKING THEM

CROSS-REFERENCE TO RELATED APPLICATIONS

This application claims priority under 35 U.S.C. §119 to U.S. Provisional Patent Application Ser. No. 60/974,039, filed Sep. 20, 2007; and to European Patent Application no. 08156018.7, filed May 9, 2008, each of which is hereby incorporated herein by reference in its entirety.

FIELD OF THE INVENTION

The present invention relates generally to semiconductor devices comprising a MOSFET (Metal-Oxide-Semiconductor Field Effect Transistor), and methods for making them. The present invention relates more particularly to MOSFET transistors having a gate stack comprising a material with high dielectric constant and doped poly-silicon as gate electrode, and methods for making them.

TECHNICAL BACKGROUND

Scaling MOSFET transistors to improve performance results in higher gate leakage as the $SiO_2$ gate dielectric becomes thinner. To address this issue, $SiO_2$ gate dielectric are often replaced with high-k dielectrics. A high-k dielectric is a dielectric featuring a dielectric constant (k) higher than the dielectric constant of $SiO_2$, i.e. k>3.9. High-k dielectrics allow for a larger physical thickness (compared to $SiO_2$) for obtaining a same effective capacitance than can be obtained with a much thinner $SiO_2$ layer. The larger physical thickness of the high-k material can reduce gate leakage currents. Typical examples of high-k dielectrics are Hf-based or Al-based materials (e.g. Hf oxides or Al oxides).

With the introduction of the high-k dielectrics a new problem appeared: Fermi level pinning. The Fermi level pinning effect occurs at the polysilicon (poly-Si)/metal oxide interface and causes high threshold voltages in MOSFET devices. For Hf-based materials, the interfacial Si—Hf bonds create dipoles. This pins the Fermi level just below the poly-Si conduction band and increases the poly-Si depletion of p-doped gates. For $Al_2O_3$ gate dielectrics, the Si—O—Al bonds the Fermi level just above the Si valence band. The Al at the interface behaves as a dopant and increases the poly-Si depletion of n-doped gates.

One solution to this problem is the introduction of metal gates. However, it has been proven difficult to identify band-edge metals (metals with either a n-type or a p-type work function (WF)) that are compatible with the conventional CMOS (Complementary Metal-Oxide-Semiconductor) manufacturing process. CMOS can be made using dual metal gates with single or dual dielectrics. In either case, a selective removal of one of the metal gates and/or dielectrics is necessary and adds substantial complexity and costs to the manufacturing process.

Another solution to the problem of Fermi level pinning is to use Fully Silicided (FUSI) gates, without a selective removal of electrode or gate dielectric. However, FUSI gates require different silicide phases on nMOS and pMOS regions. On small devices, the phase or composition of the FUSI gates tends to distribute unevenly, which can result in severe within-wafer threshold voltage ($V_t$) non-uniformity.

SUMMARY OF THE INVENTION

The present invention, in one aspect, relates to a MOSFET structure with a high-k material as gate dielectric and a gate electrode such as a polysilicon gate electrode. An advantage of embodiments of the present invention is that the performance of the structure is not affected adversely.

The present invention, in another aspect, relates to the provision of a method to manufacture such a MOSFET structure. An advantage of some embodiments of the present invention is that the method can reduce or overcome at least one drawback of prior art methods, and that a MOSFET structure can be provided with improved performance compared to prior art devices.

In a first aspect the present invention relates to a semiconductor device comprising a first MOSFET transistor comprising a substrate, a first high-k dielectric layer upon the substrate, a first dielectric capping layer upon the first high-k dielectric and a first gate electrode made of a semiconductor material of a first doping level and a first conductivity type upon the first dielectric capping layer, wherein the first dielectric capping layer is made from a Sc-based material (i.e. the material comprises Scandium).

In one embodiment of the first aspect of the present invention, the semiconductor device further comprises a second MOSFET transistor comprising a substrate, a second high-k dielectric layer upon the substrate, a second dielectric capping layer upon the second high-k dielectric and a second gate electrode, made of a semiconductor material of a second doping level and a second conductivity type, upon the second dielectric capping layer, wherein the first high-k dielectric layer and the second high-k dielectric layer have the same thickness and the same material composition, and the first dielectric capping layer and the second dielectric capping layer have the same thickness and the same material composition. The substrate upon which the first high-k dielectric is disposed can be the same substrate upon which the second high-k dielectric is disposed.

In another embodiment of the first aspect of the present invention, the second doping level is different than the first doping level.

In another embodiment of the first aspect of the present invention, the second conductivity type is opposite to the first conductivity type.

In yet another embodiment of the first aspect of the present invention, the first MOSFET is a nMOS transistor and the second MOSFET is a pMOS transistor.

In one embodiment of the first aspect of the present invention, the first dielectric capping layer and the second dielectric capping layer comprise a Sc-based material.

In another embodiment of the first aspect of the present invention, the first dielectric capping layer and the second dielectric capping layer are selected from the group consisting of Sc oxide, Sc silicate and mixtures thereof.

In yet another embodiment of the first aspect of the present invention the first dielectric capping layer and the second dielectric capping layer consist of $Sc_2O_3$.

The first high-k dielectric layer and the second high-k dielectric layer can, for example, be selected from the group consisting of SiON, Hf-silicate (i.e., $HfSiO_x$), $HfO_2$, $ZrO_2$ and mixtures thereof.

The substrate can, for example, comprise Si, Silicon-on-Insulator (SOI), Ge, Germanium-on-Insulator (GeOI), III-V materials or combinations thereof.

In one embodiment of the first aspect of the present invention the semiconductor material is polysilicon. In alternative embodiments, the gate electrode can comprise any other semiconductor material which interacts with high-k material leading to Fermi-level pinning. In general, any Si-based semiconductor material (e.g. amorphous Si or poly-silicon-germanium) due to the presence of Si at the interface will interact in the same way with the high-k material, leading to Fermi level pinning.

In a second aspect of the present invention a method for manufacturing a semiconductor device comprising a first MOSFET transistor and a second MOSFET transistor, the method being applied to a substrate comprising a first region and a second region, the method comprising depositing a layer of high-k dielectric ($k>k_{SiO2}$) overlying the first and the second region of the substrate, depositing a dielectric capping layer overlying the high-k dielectric, depositing a semiconductor material overlying the dielectric capping layer, doping the semiconductor material to achieve a first conductivity type on the first region and a second conductivity type on the second region, characterized in that, the dielectric capping layer is made of a Sc-based material.

In one embodiment of the second aspect of the present invention, the second conductivity type is opposite to the first conductivity type.

In another embodiment of the second aspect of the present invention, the first MOSFET is a nMOS transistor and the second MOSFET is a pMOS transistor.

The substrate can, for example, comprise Si, SOI, Ge, GeOI, III-V materials or combinations thereof.

The high-k material can be, for example, selected from the group consisting of SiON, Hf-silicate, $HfO_2$, $ZrO_2$ and mixtures thereof.

In one embodiment of the second aspect of the present invention, the semiconductor material is polysilicon.

In another embodiment of the second aspect of the present invention, the dielectric capping layer comprises scandium.

In yet another embodiment of the second aspect of the present invention, the dielectric capping layer is selected from the group consisting of Sc oxide, Sc-silicate and mixtures thereof.

In one embodiment of the second aspect of the present invention, the dielectric capping layer comprises or consists of $Sc_2O_3$.

BRIEF DESCRIPTION OF THE DRAWINGS

All drawings are intended to illustrate some aspects and embodiments of the present invention. The drawings schematic in nature and, unless otherwise noted, are not intended to limit the invention.

DETAILED DESCRIPTION OF CERTAIN EMBODIMENTS

Figure 1:
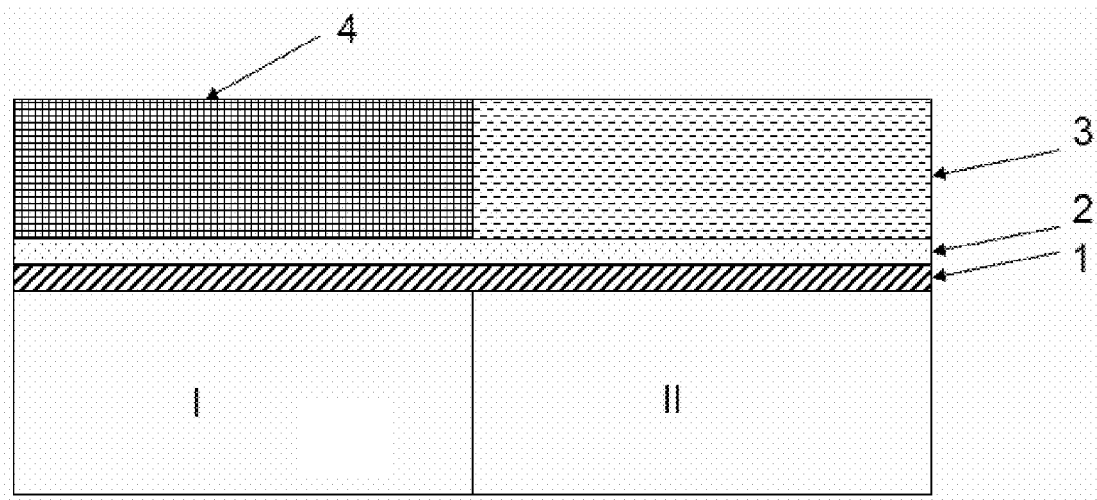
FIG. 1 represents schematically a gate stack on top of a substrate comprising two regions (I, II), the gate stack comprising a gate dielectric (1), a dielectric capping layer (2) and gate electrode consisting of a semiconductor material of a first conductivity type (3) and a semiconductor material of a second conductivity type (4) in accordance with an embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Where the term "comprising" is used in the present description and claims, it does not exclude other elements or steps. Where an indefinite or definite article is used when referring to a singular noun e.g. "a" or "an", "the", this includes a plural of that noun unless another meaning is specifically stated.

Furthermore, the terms "first," "second" and the like in the description and in the claims, are used for distinguishing between similar elements and not necessarily for describing a sequence, either temporally, spatially, in ranking or in any other manner; or for limiting the number of the elements so described. It is to be understood that the terms so used are interchangeable under appropriate circumstances and that the embodiments of the invention described herein are capable of operation in other sequences than described or illustrated herein.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification do not necessarily all refer to the same embodiment. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In a first aspect of the present invention a semiconductor device comprises a MOSFET transistor having a substrate, a first high-k dielectric (i.e., $k>k_{SiO2}$) layer upon the substrate, a first dielectric capping layer upon the first high-k dielectric and a first gate electrode made of a semiconductor material of a first doping level and a first conductivity type upon the first dielectric capping layer, characterized in that the first dielectric capping layer comprises scandium (Sc). The dielectric constant of the high-k dielectric materials described herein can be, for example, greater than 4, or even greater than 5.

FIG. 1 represents schematically a gate stack of a MOSFET transistor comprising a substrate comprising two regions (I, II), a gate dielectric (1), a dielectric capping layer (2) and a gate electrode comprising or consisting of a semiconductor material of a first conductivity type (3) overlying the dielectric capping layer (2) on the second region (II) and a semiconductor material of a second conductivity type (4) overlying the dielectric capping layer (2) on the first region (I). The gate dielectric (1) comprises a high-k material (i.e. $k>k_{SiO2}$).

A purpose of the gate dielectric (1) is to act as a dielectric barrier between the gate electrode and the channel region under the gate stack of the MOSFET transistor.

A purpose of the dielectric capping layer (2) is to reduce or eliminate the Fermi level pinning effect between the gate dielectric (1) and the gate electrode comprising or consisting of a semiconductor material of a first conductivity type (3) or of a second conductivity type (4), e.g. (doped) polysilicon (3,4), and thus allowing CMOS applications with high-k gate dielectric and a polysilicon gate.

The gate dielectric (1) comprises or consists of a first high-k dielectric layer overlying the first substrate region (I) and a second high-k dielectric layer overlying the second substrate region (II), wherein the first high-k dielectric layer and the second high-k dielectric layer have the same thickness and the same material composition.

The dielectric capping layer (2) comprises or consists of a first dielectric capping layer overlying the first substrate region (I) and a second dielectric capping layer overlying the second substrate region (II), wherein the first dielectric capping layer and the second dielectric capping layer have the same thickness and the same material composition.

It is an advantage of certain embodiments of the invention that a same dielectric material, also referred to as gate dielectric (1) and dielectric capping layer (2), is used for different semiconductor structures of a semiconductor device. Since one gate dielectric and one dielectric capping layer can be used for the different semiconductor structures, the process is similar to the well-known conventional CMOS processes and gives better control of the integrity performance of the gate dielectric material.

It is an advantage of certain embodiments that a polysilicon gate electrode is used for different semiconductor structures (e.g. for both NMOS and PMOS transistors) comprising a high-k dielectric layer, which can significantly reduce the cost of the advanced CMOS manufacturing as compared to the metal gated devices. The workfunction of a polysilicon gate electrode can be tuned by ion implantation, whereas the workfunction of a metal gate electrode is a material property which cannot be changed easily. Moreover, polysilicon gate is still the most widely spread gate electrode currently in manufacturing because of its flexibility in WF tuning and process friendliness.

The dielectric capping layer (2) deposited upon the gate dielectric (1) prior to the polysilicon/doped polysilicon layer (3,4) can have the following features:

(1) It does not significantly change the work function (WF) of the gate, being in this way suitable for both nMOS and pMOS gates;
(2) It reduces or eliminates Fermi level pinning at the interface between the (doped)polysilicon and the gate dielectric; and
(3) It does not significantly increase the equivalent oxide thickness (EOT) of the gate dielectric, being in this way suitable for EOT scaling.

For example, the dielectric capping layer disclosed (2) is deposited both on the nMOS (I) and pMOS (II) regions and does not require supplementary masking steps and/or selective removal of the gate dielectric (1) or metal gates. In accordance with an embodiment of the present invention the pMOS and nMOS work functions are obtained by doping the polysilicon electrode. Doping the polysilicon can be performed, for example, either by using a conventional ion implantation process or by introducing dopants during polysilicon deposition. Therefore, the foregoing embodiments can substantially reduce the integration complexity and manufacturing costs. Other semiconductor materials, for example amorphous Si, polySiGe, III-V compound semiconductors, can be used as gate electrode.

An alternative WF tuning method is using different materials (e.g. metals, metal silicides, stack of different metal layers) as gate electrode on nMOS and pMOS transistors, with selective removal needed on either nMOS or pMOS. Implantation/doping can be used on metal gates as well to fine tune (slightly modify) their WF.

In a first embodiment of the first aspect of the present invention, the semiconductor device comprises a MOSFET transistor, which can be either a NMOS or a PMOS transistor.

In a second embodiment of the first aspect of the present invention, the semiconductor device comprises at least two MOSFET transistors, either NMOS or PMOS, with different doping levels.

In a third embodiment of the first aspect of the present invention, the semiconductor device comprises at least two MOSFET transistors with opposite conductivity types, e.g. a NMOS and a PMOS transistor.

In one embodiment of the first aspect of the present invention the dielectric capping layer has a thickness smaller than 2 nm, preferably smaller than 1.5 nm and even more preferably smaller than 1 nm and comprises Scandium (Sc) based materials, e.g. Sc oxides, Sc-silicates, or combinations thereof.

The high-k dielectric layer (1) can be, for example, selected from the group consisting of SiON, $HfSiO_x$, $HfO_2$, $ZrO_2$ and mixtures thereof. These can present the advantage of a stable, high quality dielectric barrier between the gate electrode, and the channel region of the semiconductor structures forming the semiconductor device.

The substrate can, for example, comprise Si, Silicon-On-Insulator (SOI), Ge, Germanium on Insulator (GeOI), III-V materials or combinations thereof. The III-V materials can comprise GaAs, InP, InSb and combinations thereof.

The dielectric capping layer comprising Sc oxides preferably does not change the WF of the gate and does not exhibit the Fermi level pinning between the gate dielectric and polysilicon gate electrode. This allows adjusting the WF of polysilicon gate by conventional methods, e.g. ion implantation or doping at polysilicon deposition.

The invention will now further be described in detail making use of several particular embodiments. It is clear that other embodiments of the invention can be configured according to the knowledge of persons skilled in the art without departing from the true spirit or technical teaching of the invention, the invention being limited only by the terms of the appended claims.

Figure 2:
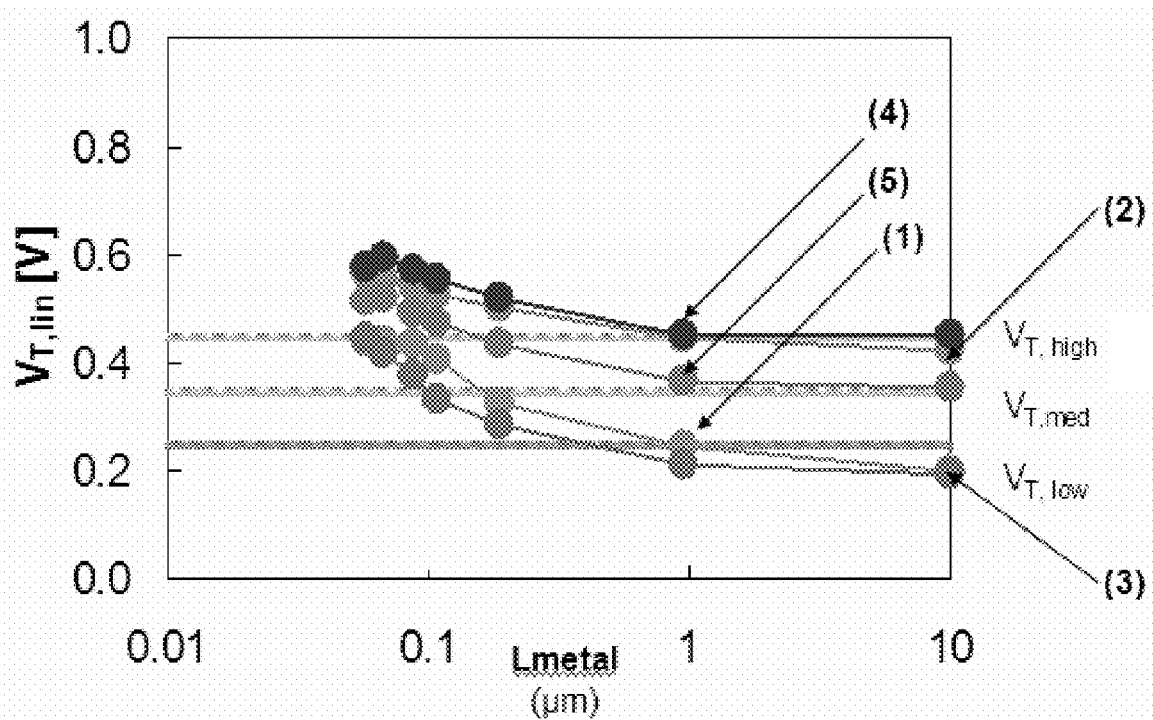
FIG. 2 represents the threshold voltage $V_{t,lin}(V)$ as a function of the gate electrode length $L_{metal}$ (µm) for different gate stacks: (1) SiON/poly-Si (reference); (2) SiON/TaN (metal gated reference); (3) SiON/$Dy_2O_3$/TaN; (4) SiON/$Sc_2O_3$/TaN; (5) SiON/DyScO$_3$/TaN.

FIG. 2 represents the threshold voltage $V_{t,lin}(V)$ as a function of the gate electrode length $L_{metal}$ (μm) for different gate stacks. FIG. 2 shows that with TaN metal gates and $Sc_2O_3$ dielectric capping layer on SiON gate dielectric (curve 4), the nMOS threshold voltage $V_t$ is not changed with respect to the reference (curve 2, TaN/SiON). Whereas both $Dy_2O_3$ (3) and $DyScO_3$ (5) dielectric capping layers, when used separately on SiON with TaN metal gates reduce the nMOS $V_t$ by decreasing the effective WF.

Figure 3:
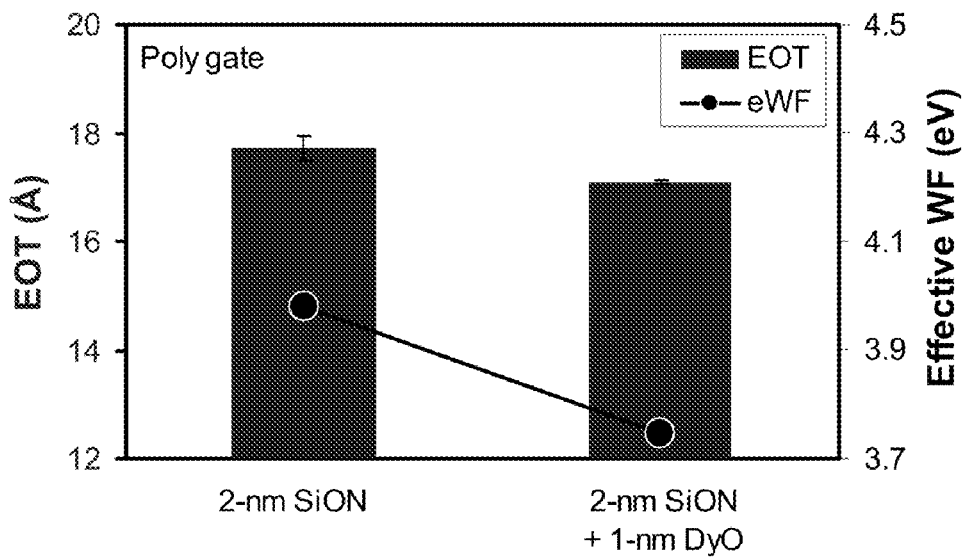
FIG. 3 represents the equivalent oxide thickness (EOT(Å)) and the effective work function eWF (eV) values for (1) 2 nm SiON/poly-Si and (2) 2 nm SiON/1 nm DyO/poly-Si gate stacks.

FIG. 3 shows that with poly-Si gates, the presence of $Dy_2O_3$ as dielectric capping layer is able to reduce the effective WF by 200 mV with respect to the reference (SiON/poly-Si), the effect obtained in this case being the same as in the case of TaN gates (FIG. 2). Reasoning further, Sc oxides will show similar behavior in case of poly-Si gate electrodes as in the case of TaN gate electrodes (FIG. 2), reducing or eliminating the Fermi-level pinning effect and having little or no influence on the threshold voltage $V_t$.

Figure 4:
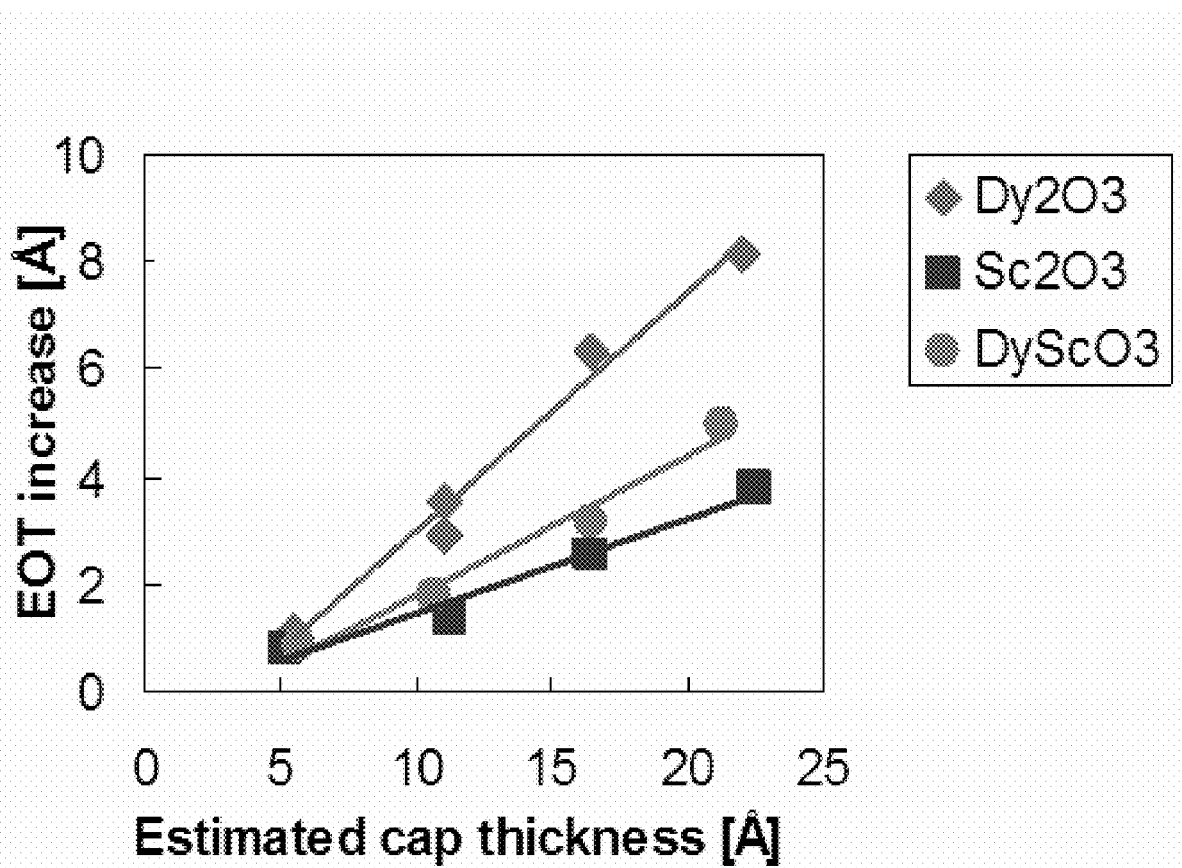
FIG. 4 represents the EOT(Å) increase as function of the estimated cap layer thickness (Å) for: (◆)$Dy_2O_3$ (k-value ~9); (■) $Sc_2O_3$ (k-value ~22); (●) DyScO$_3$ (k-value ~15).

Scandium oxide ($Sc_2O_3$) as a dielectric capping layer does not significantly increase the equivalent oxide thickness (EOT) of the gate dielectric. FIG. 4 shows that as compared to an uncapped reference, the EOT increase of $Sc_2O_3$-capped HfSiON is substantially smaller than the EOT increase in case of $Dy_2O_3$- and DyScOs-capped HfSiON 1 nm $Sc_2O_3$ increases the EOT by less than 2 Å.

Figure 5:
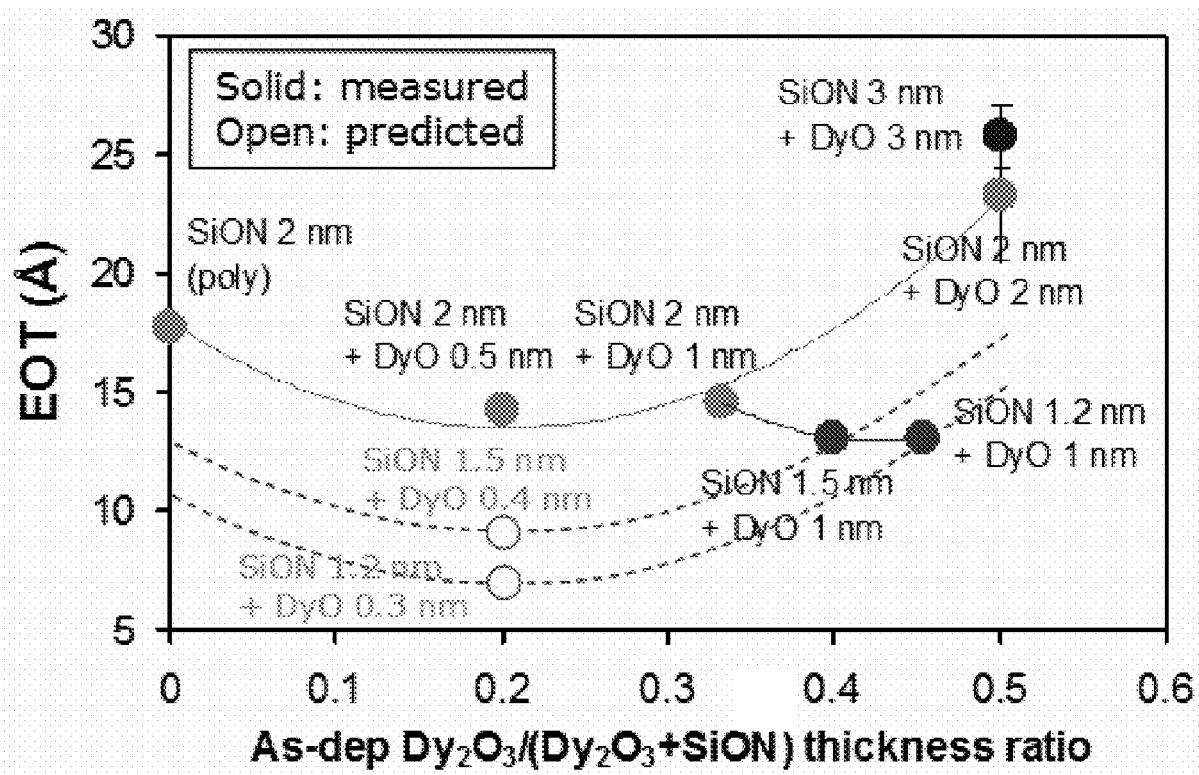
FIG. 5 represents the EOT(A) value for $Dy_2O_3$/SiON gate stacks as function of the as-deposited $Dy_2O_3$/($Dy_2O_3$+SiON) thickness ratio: (●) measured; (○) predicted.
Figure 6A:
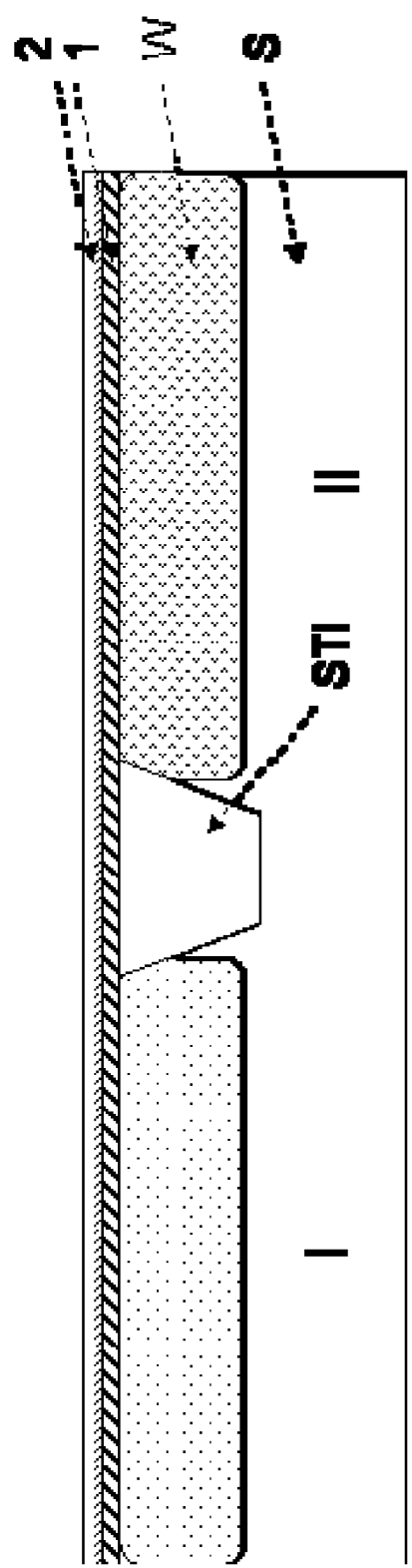
FIG. 6 (a)-(i) represents schematically the process steps of a conventional CMOS process flow which make use of the dielectric capping layer (2) as described by the present invention.
Figure 6B:
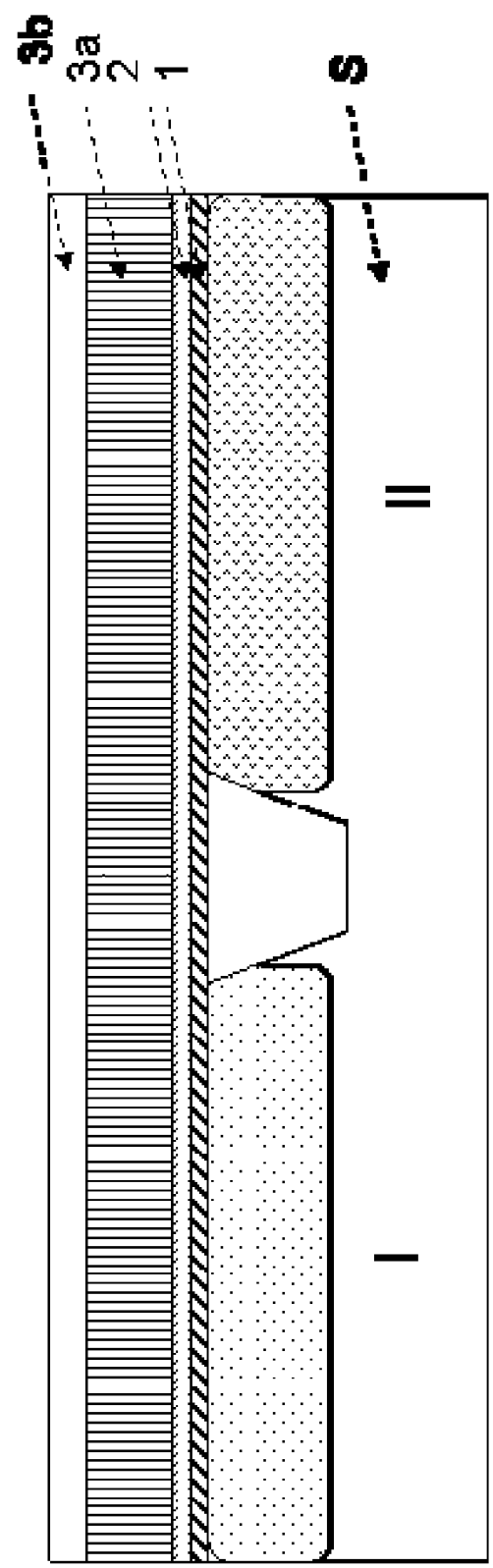
Figure 6C:
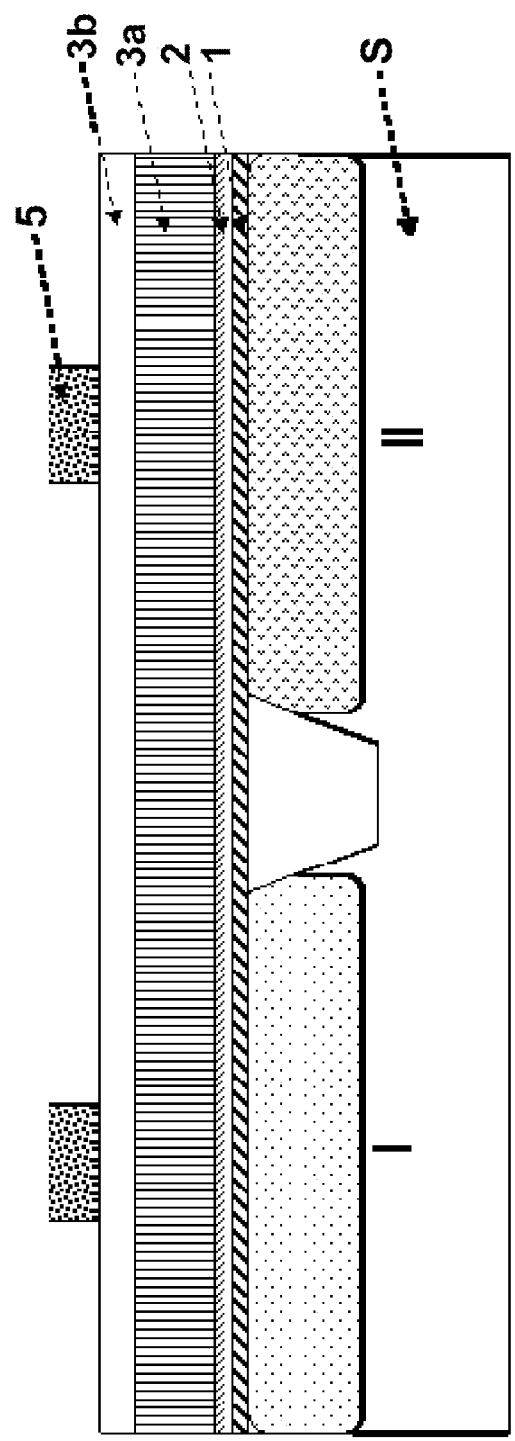
Figure 6D:
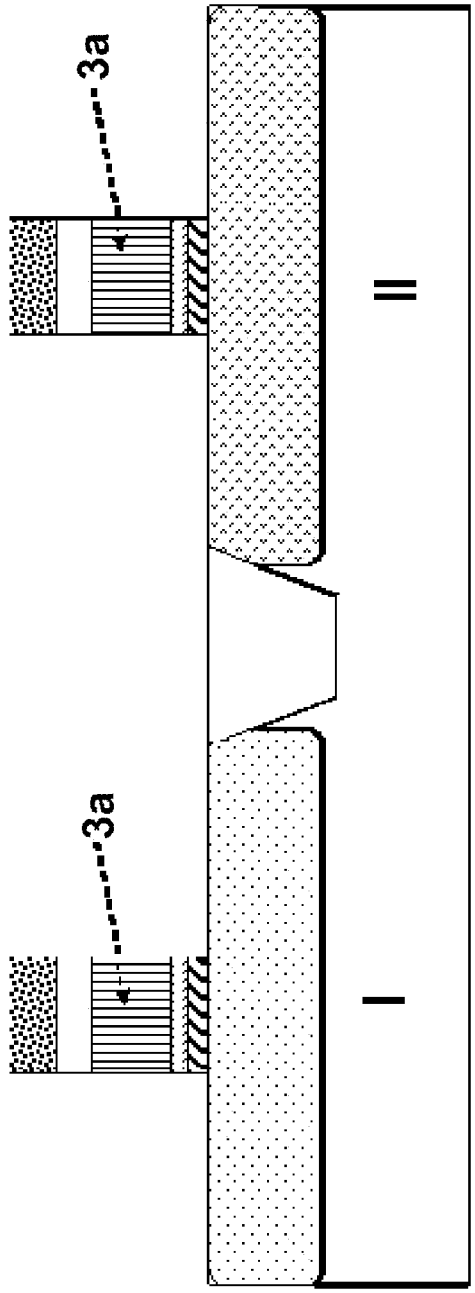
Figure 6I:
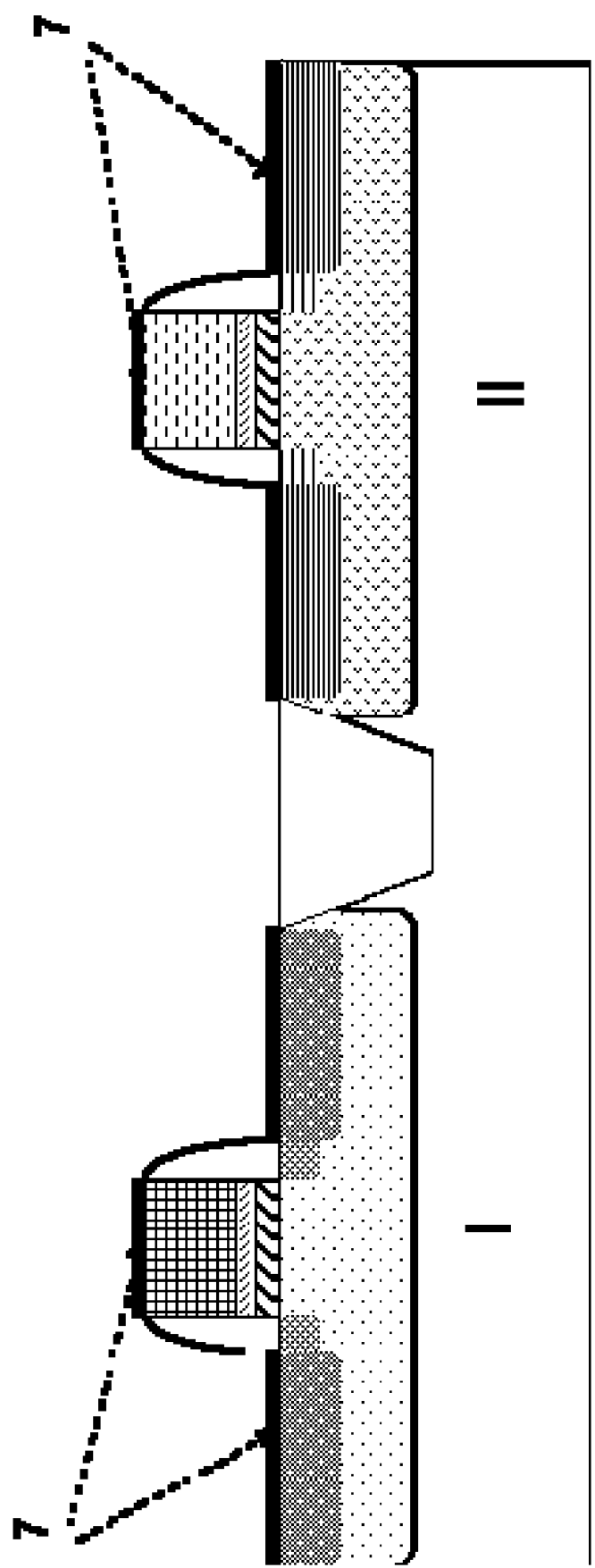

FIG. 5 shows that when ultrathin $Dy_2O_3$ (<2 nm) is capped on SiON, the EOT does not increase; in fact, for a $Dy_2O_3/(Dy_2O_3+SiON)$ thickness ratio of about 0.4 the EOT decreases. However, with thick cap layers, the EOT increases substantially. Therefore, in one embodiment of the invention, thick rare-earth oxide cap layers (>about 2 nm), are not used.

The dielectric capping layer can comprise Sc-based materials, e.g. Sc oxides, Sc oxynitrides, Sc silicates, and combinations thereof, that do not significantly change the WF of the gate.

The dielectric capping layer thickness ranges from 0.2 to 1.5 nm, the upper limit being related to the EOT requirements for advanced MOSFET devices.

In a second aspect of the present invention a method is disclosed for manufacturing a semiconductor device, comprising a first MOSFET transistor and a second MOSFET transistor, and having a substrate comprising a first and a second region, the method comprising: depositing a layer of high-k dielectric (i.e. $k>k_{SiO2}$) overlying the first and the second region of the substrate, depositing a dielectric capping layer, overlying the high-k material, depositing a semiconductor material overlying the dielectric capping layer, doping the semiconductor material to achieve a first conductivity type on the first region and a second conductivity type on the second region, characterized in that the dielectric capping layer comprises Scandium.

In a second embodiment of the second aspect of the present invention, the first MOSFET transistor and the second MOSFET transistor are either NMOS or PMOS transistors, with different doping levels.

In a third embodiment of the second aspect of the present invention, the first and the second MOSFET transistors have opposite conductivity types, e.g. a NMOS and a PMOS transistor.

FIG. 6 (a)-(i) represent schematically the implementation of an embodiment of the present invention in a conventional CMOS process comprising the following steps: (a) forming active areas and wells (W) on a substrate (S) on both the nMOS (I) and the pMOS (II) regions, separated by a shallow trench isolation (STI), followed by gate dielectric deposition, the gate dielectric comprising a high-k dielectric layer (1) and a dielectric capping layer (2); (b) gate electrode deposition, the gate electrode comprising an undoped polysilicon (3a) and a hard mask (i.e. Si oxide or Si nitride) (3b); (c) photoresist (5) patterning; (d) gate stack patterning, the gate stack comprising the gate dielectric (1,2), the gate electrode (3a) and the hard mask (3b), followed by optionally removing the hard mask (3b); (e) forming LDD (low doped drain) and implanting the polysilicon gate electrode (4) on region (I), while region (II) is protected/covered by a layer of photoresist (5'); (f) forming LDD (low doped drain) and implanting polysilicon gate electrode (3) on region (II), while region (I) is protected/covered by a layer of photoresist (5'); (g) forming insulator spacers (6); (h) forming HDD (highly doped drain) on region (I), while region (II) is covered/protected and, subsequently, forming HDD on region (II), while region (I) is covered/protected; (i) forming a layer of metal silicide (7) on source, drain and gate on both regions (I, II), thereby defining the contacts to the nMOS and the pMOS transistors, respectively. Alternatively, the doped polysilicon (3,4) gate electrode can be formed by in-situ doping during polysilicon deposition.

In one embodiment of the second aspect of the present invention the dielectric capping layer has a thickness smaller than 2 nm, preferably smaller than 1.5 nm and even more preferably smaller than 1 nm and comprises Sc-based materials, e.g. Sc oxide ($Sc_2O_3$), Sc silicates, or combinations thereof.

The foregoing description details certain embodiments of the invention. It will be appreciated, however, that no matter how detailed the foregoing appears in text, the invention may be practised in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the scope of the invention.

The invention claimed is:

1. A semiconductor device comprising a first MOSFET comprising:
   a substrate,
   a first high-k dielectric layer upon the substrate,
   a first dielectric capping layer upon the first high-k dielectric, and
   a first gate electrode made of a semiconductor material of a first doping level and a first conductivity type upon the first dielectric capping layer,
   wherein the first dielectric capping layer is made from a Sc-based material and is less than 2 nm in thickness.

2. The semiconductor device of claim 1, further comprising a second MOSFET comprising
   the substrate,
   a second high-k dielectric layer upon the substrate,
   a second dielectric capping layer upon the second high-k dielectric, and
   a second gate electrode, made of a semiconductor material of a second doping level and a second conductivity type, upon the second dielectric capping layer, wherein the first dielectric capping layer and the second dielectric capping layer have the same thickness and the same material composition.

3. The semiconductor device of claim 2, wherein the second doping level is different than the first doping level.

4. The semiconductor device of claim 2, wherein the second conductivity type is opposite to the first conductivity type.

5. The semiconductor device of claim 2, wherein the first MOSFET is a nMOS transistor and the second MOSFET is a pMOS transistor.

6. The semiconductor device of claim 2, wherein the first dielectric capping layer and the second dielectric capping layer are selected from the group consisting of Sc oxide, Sc silicate and mixtures thereof.

7. The semiconductor device of claim 6, wherein the first dielectric capping layer and the second dielectric capping layer comprise $Sc_2O_3$.

8. The semiconductor device of claim 2, wherein one or both of the first high-k dielectric layer and the second high-k dielectric layer are selected from the group consisting of SiON, Hf silicate, $HfO_2$, $ZrO_2$ and mixtures thereof.

9. The semiconductor device of claim 2, wherein the semiconductor material is polysilicon.

10. The semiconductor device of claim 1, wherein the first dielectric capping layer is selected from the group consisting of Sc oxide, Sc silicate and mixtures thereof.

11. The semiconductor device of claim 10, wherein the first dielectric capping layer comprises $Sc_2O_3$.

12. The semiconductor device of claim 1, wherein the first high-k dielectric layer is selected from the group consisting of SiON, Hf silicate, $HfO_2$, $ZrO_2$ and mixtures thereof.

13. The semiconductor device of claim 1, wherein the semiconductor material is polysilicon.

14. A method for manufacturing a semiconductor device comprising a first MOSFET and a second MOSFET, applied to a substrate comprising first and second region, the method comprising:
depositing a layer of high-k dielectric overlying the first and the second regions of the substrate,
depositing a dielectric capping layer overlying the high-k dielectric,
depositing a semiconductor material overlying the dielectric capping layer, and
doping the semiconductor material to achieve a first conductivity type on the first region and a second conductivity type on the second region, wherein the dielectric capping layer is made of a Sc-based material and is less than 2 nm in thickness.

15. The method of claim 14, wherein the second conductivity type is opposite to the first conductivity type.

16. The method of claim 14, wherein the first MOSFET is a nMOS transistor and the second MOSFET is a pMOS transistor.

17. The method of claim 14, wherein the semiconductor material is polysilicon.

18. The method of claim 14, wherein the dielectric capping layer is selected from the group consisting of Sc oxide, Sc silicate and mixtures thereof.

19. The method of claim 14, wherein the dielectric capping layer consists of $Sc_2O_3$.

* * * * *